United States Patent
Jayaraju et al.

(10) Patent No.: US 10,154,598 B2
(45) Date of Patent: Dec. 11, 2018

(54) FILLING THROUGH-HOLES

(71) Applicant: Rohm and Haas Electronic Materials LLC, Marlborough, MA (US)

(72) Inventors: Nagarajan Jayaraju, Framingham, MA (US); Leon R. Barstad, Raynham, MA (US); Elie H. Najjar, Norwood, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 183 days.

(21) Appl. No.: 14/872,204

(22) Filed: Oct. 1, 2015

(65) Prior Publication Data
US 2016/0105975 A1    Apr. 14, 2016

Related U.S. Application Data

(60) Provisional application No. 62/063,374, filed on Oct. 13, 2014.

(51) Int. Cl.
*H05K 3/42*     (2006.01)
*C25D 5/18*     (2006.01)
*C25D 7/00*     (2006.01)
*C25D 3/38*     (2006.01)
*C23C 18/16*    (2006.01)

(52) U.S. Cl.
CPC ............... *H05K 3/424* (2013.01); *C25D 5/18* (2013.01); *C25D 7/00* (2013.01); *H05K 3/423* (2013.01); *C23C 18/1653* (2013.01); *C25D 3/38* (2013.01); *H05K 2201/09563* (2013.01); *H05K 2203/1492* (2013.01)

(58) Field of Classification Search
CPC .................................. H05K 3/423; C25D 5/18
See application file for complete search history.

(56) References Cited

U.S. PATENT DOCUMENTS

| | | | |
|---|---|---|---|
| 5,972,192 A * | 10/1999 | Dubin | C25D 3/38 205/101 |
| 6,210,555 B1 | 4/2001 | Taylor et al. | |
| 6,524,461 B2 | 2/2003 | Taylor et al. | |
| 6,808,612 B2 | 10/2004 | Hey et al. | |
| 6,827,833 B2 * | 12/2004 | Taylor | C25D 5/18 205/102 |
| 7,144,805 B2 | 12/2006 | Chen et al. | |
| 7,575,666 B2 * | 8/2009 | Watkowski | C25D 3/38 205/210 |

(Continued)

FOREIGN PATENT DOCUMENTS

| | | |
|---|---|---|
| JP | 2004128053 | 4/2004 |
| JP | 2013219305 | 10/2013 |

OTHER PUBLICATIONS

Search report from corresponding Europe 15189090.2-1373 application, dated Mar. 11, 2016.

(Continued)

*Primary Examiner* — Bryan D. Ripa
(74) *Attorney, Agent, or Firm* — John J. Piskorski

(57) ABSTRACT

Pulse plating methods which include a forward pulse but no reverse pulse inhibit or reduce dimpling and voids during copper electroplating of through-holes in substrates such as printed circuit boards. The pulse plating methods may be used to fill through-holes with copper where the through-holes are coated with electroless copper or flash copper.

6 Claims, 3 Drawing Sheets

(56) References Cited

U.S. PATENT DOCUMENTS

| | | | |
|---|---|---|---|
| 8,048,280 B2 | 11/2011 | Mayer et al. | |
| 8,065,794 B2 | 11/2011 | En et al. | |
| 8,268,158 B2 | 9/2012 | Niazimbetova et al. | |
| 2001/0013472 A1 | 8/2001 | Nakamura et al. | |
| 2003/0221966 A1 | 12/2003 | Bonkass et al. | |
| 2004/0011654 A1 | 1/2004 | Nakamura | |
| 2005/0157475 A1* | 7/2005 | Edwards | C25D 3/38 |
| | | | 361/748 |
| 2006/0012044 A1 | 1/2006 | Knop et al. | |
| 2006/0151328 A1 | 6/2006 | Reents et al. | |
| 2006/0226014 A1 | 10/2006 | Chuang et al. | |
| 2007/0235220 A1 | 10/2007 | Shin et al. | |
| 2009/0108436 A1* | 4/2009 | Fujii | H01L 21/486 |
| | | | 257/693 |
| 2009/0188804 A1 | 7/2009 | Knop et al. | |
| 2009/0294293 A1 | 12/2009 | Zahraoui et al. | |
| 2011/0062594 A1* | 3/2011 | Maekawa | H01L 21/486 |
| | | | 257/774 |
| 2012/0153495 A1* | 6/2012 | Mallik | H01L 23/48 |
| | | | 257/774 |
| 2014/0262794 A1 | 9/2014 | Gebregziabiher et al. | |

OTHER PUBLICATIONS

Search report from corresponding Japanese 2015-200996 application, dated Sep. 23, 2016.
Search report for corresponding Taiwan Application No. 104133417 dated Sep. 21, 2016.
Search report from corresponding Europe 15189090.2-1373 application, dated Mar. 3, 2016.

* cited by examiner

FILLING THROUGH-HOLES

FIELD OF THE INVENTION

The present invention is directed to a method of filling through-holes. More specifically, the present invention is directed to a method of filling through-holes using a pulse plating method with forward pulse and no reverse pulse.

BACKGROUND OF THE INVENTION

High density interconnects is an important design in the fabrication of printed circuit boards with through-holes. Miniaturization of these devices relies on a combination of thinner core materials, reduced line widths and smaller diameter through-holes. The diameters of the through-holes range from 75 µm to 200 µm. Filling the through-holes by copper plating has become more and more difficult with higher aspect ratios. This results in larger voids and deeper dimples. Another problem with through-hole filling is the way they tend to fill. Unlike vias which are closed at one end through-holes pass through a substrate and are open at two ends. Vias fill from bottom to top. In contrast, when through-holes are being filled with copper, the copper tends to begin to deposit on the walls at the center of the through-hole where it plugs at the center forming "butterfly wings" or two vias. The two vias fill to complete the deposition of the holes. Accordingly, the copper plating baths used to fill vias are not typically the same as are used to fill through-holes. Plating bath levelers and other bath additives are chosen to enable the right type of fill. If the right combination of additives is not chosen then the copper plating results in undesired conformal copper deposition.

Often the copper fails to completely fill the through-hole and both ends remain unfilled. An incomplete through-hole fill with copper deposit in the center with unfilled ends is sometimes referred to as "dog-boning". The open spaces at the top and bottom of the holes are referred to as dimples. Entire dimple elimination during through-hole filling is rare and unpredictable. Dimple depth is perhaps the most commonly used metric for quantifying through-hole fill performance. Dimple requirements depend on through-hole diameter and thickness and it varies from one manufacturer to another. In addition to dimples, gaps or holes referred to as voids may form within a copper through-hole fill. Larger dimples affect further processing of the panel and larger voids affect device performance. An ideal process completely fills through-holes with a high degree of planarity, i.e., build up consistency, without voids to provide optimum reliability and electrical properties and at as low as possible a surface thickness for optimum line width and impedance control in an electrical device.

In order to address the foregoing problems the industry typically uses two different electroplating baths when attempting to plug and fill through-holes. A first copper bath is used to fill the though-holes until the two vias are formed in the through-holes as mentioned above. A second bath having a substantially different formulation specifically directed to filling vias replaces the first bath to complete the filling process. However, this process is both time consuming and inefficient. The through-hole filling process must be closely monitored to gauge the time when the first bath must be replaced with a via filling bath. Failure to change baths at the correct time typically results in dimple and void formation. Moreover, using two distinct plating baths for a single process increase the cost to both the manufacture and the customer. The plating process must be stopped to change the baths, thus further reducing the efficiency of the process.

In addition, the thickness of substrates such as printed circuit boards is increasing. Many conventional printed circuit boards now have a thickness exceeding 100 µm. While conventional direct current plating has been successful in providing acceptable through-hole fill under some circumstances for printed circuit boards having a thickness of 100 µm or less, attempts to fill through-holes in boards with thickness ranges exceeding 100 µm has been less than satisfactory. Often, the through-holes have unacceptable amounts of dimples exceeding 10 µm in depth and average void areas in the through-holes in excess of 10% to 15%.

Another problem encountered in metal plating is the formation of nodules on the metal deposit. Nodules are believed to be crystals of the metal being plated and grow out of the plated surface. Nodules may range in diameter from less than 1 micron to as large as several millimeters. Nodules are undesirable for a variety of electrical, mechanical, and cosmetic reasons. For example, nodules are readily detached and carried by cooling air flows into electronic assemblies, both within and external to electronic article housings, where they may cause short-circuit failure. Therefore, the nodules have to be removed before the plated substrates are assembled into electronic articles. Conventional methods of removing the nodules involve laser inspection of each metal plated substrate followed by manual removal of the nodules by workers using microscopes. Such conventional methods leave room for worker error and are inefficient.

Accordingly, there is a need for a method to improve through-hole filling of substrates such as printed circuit boards.

SUMMARY OF THE INVENTION

Methods include providing a substrate with a plurality of through-holes comprising a layer of electroless copper, copper flash or combinations thereof on a surface of the substrate and walls of the plurality of through-holes; immersing the substrate in a copper electroplating bath comprising an anode; and filling the through-holes with copper by a pulse plating cycle consisting of applying a forward current density for a predetermined period of time followed by interrupting the forward current density for a predetermined period of time and applying a second forward current density for a predetermined period of time and interrupting the second forward current density for a predetermined period of time and optionally repeating the cycle.

The methods reduce or inhibit dimple formation and voids during through-hole filling. Dimples are typically less than 10 µm deep. The reduced depth of the dimples and void area improves throwing power, thus providing a substantially uniform copper layer on the surface of the substrate and good through-hole filling. In addition, the methods may be used to fill though-holes of substrates having thickness ranges of 100 µm or greater. The methods also inhibit nodule formation.

DETAILED DESCRIPTION OF THE INVENTION

As used throughout this specification, the abbreviations given below have the following meanings, unless the context clearly indicates otherwise: g=gram; mL=milliliter; L=liter; cm=centimeter; µm=micron; ppm=parts per million=mg/L; ms=milliseconds; ° C.=degrees Centigrade; g/L=grams per liter; ASD=amperes/dm$^2$; DI=deionized; wt %=percent by weight; $T_g$=glass transition temperature; Void=a space free of copper within a through-hole otherwise filled with copper metal; aspect ratio of a through-hole=height of the through-hole/the diameter of the through-hole; dimple depth=distance from the deepest point of the dimple to the level of copper plated on the surface of a substrate; void area of a single through-hole=0.5 A×0.5 B×π where A is height of the void and B is the diameter of the void at its widest point in a through-hole; through-hole area=height of the through-hole×the diameter of the through-hole; and % void area=void area/through-hole area×100%.

The terms "printed circuit board" and "printed wiring board" are used interchangeably throughout this specification. The terms "plating" and "electroplating" are used interchangeably throughout this specification. The term "throwing power" means the ability to plate in low current density areas with the same thickness as in higher current density areas. All amounts are percent by weight, unless otherwise noted. All numerical ranges are inclusive and combinable in any order except where it is logical that such numerical ranges are constrained to add up to 100%.

Figure 1:
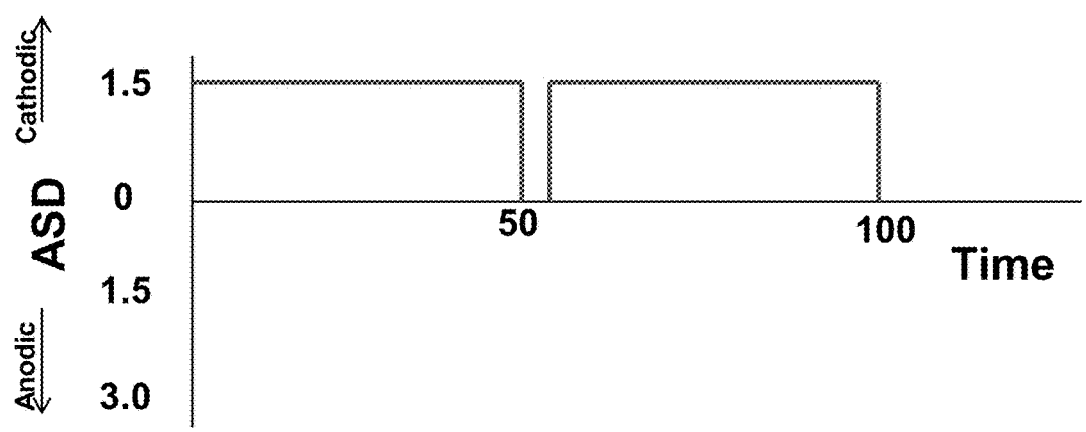
FIG. 1 is a diagram of current density vs. time in milliseconds of a forward pulse with current interruption followed by a second forward pulse with current interruption and no reverse pulse.

Forward pulse with time off and without reverse current may be used to plug and fill through-holes of substrates such as printed circuit boards. The methods reduce dimpling and voids in through-holes. The methods also inhibit nodule formation and provide a bright metal deposit. Cathodic current or forward pulse current is applied during electroplating for a predetermined amount of time such as for 10 ms to 200 ms, preferably from 20 ms to 100 ms. The cathodic or forward current is then reversed or interrupted such that the current falls to 0 ASD for a predetermined period of time such as for 0.5 ms to 5 ms, preferably from 1 ms to 2 ms. After the current is interrupted for the predetermined period of time, it is turned on again for at least a second cathodic current or forward pulse current for a predetermined period of time and then the current is interrupted. The cycle may be repeated until the through-holes are plugged and filled. The period for applying the forward current as well as the interruption period may vary for a given cycle and the current density may be varied as well in a given cycle. The number of forward pulses and interruptions for a given cycle is not limited. The pulse is never anodic or a reverse current. FIG. 1 is an example of a single cycle of a forward pulse with current interruptions and no reverse or anodic current. The current density is 1.5 ASD with a first forward pulse time of 50 ms with time off 2 ms followed by another forward pulse of 50 ms.

Prior to filling through-holes, substrates are typically plated with a layer of electroless copper such that the electroless copper is adjacent a surface of the substrate and the walls of the through-holes. Conventional electroless copper plating baths as well as conventional electroless plating methods may be used to deposit the copper layer. Such electroless copper baths and methods are well known in the art and literature. An example of a commercially available electroless copper bath is CIRCUPOSIT™ 880 Electroless Process plating formulation and method (available from Dow Electronic Materials, Marlborough, Mass.). The electroless copper may have a thickness, typically, from 0.25 µm to 6 µm, more typically from 0.25 µm to 3 µm. Optionally, the electroless copper is plated with a layer of electrolytic flash copper to protect it from corrosion. The thickness of the electroplated flash copper adjacent the electroless copper layer ranges from 0.5 µm to 15 µm, typically from 1 µm to 10 µm, more typically from 1 µm to 5 µm. Conventional electrolytic copper baths may be used to plate the flash layer. Such copper baths are well known in the art and literature.

The through-holes of the substrate typically range in diameter from 75 µm to 200 µm. The through-holes traverse the width of the substrates and are typically 100 µm to 400 µm. Substrate thicknesses may range from 100 µm or greater, typically 200 µm to 300 µm.

Substrates include printed circuit boards which may contain thermosetting resins, thermoplastic resins and combinations thereof, including fiber, such as fiberglass, and impregnated embodiments of the foregoing.

Thermoplastic resins include, but are not limited to acetal resins, acrylics, such as methyl acrylate, cellulosic resins, such as ethyl acetate, cellulose propionate, cellulose acetate butyrate and cellulose nitrate, polyethers, nylon, polyethylene, polystyrene, styrene blends, such as acrylonitrile styrene and copolymers and acrylonitrile-butadiene styrene copolymers, polycarbonates, polychlorotrifluoroethylene, and vinyl polymers and copolymers, such as vinyl acetate, vinyl alcohol, vinyl butyral, vinyl chloride, vinyl chloride-acetate copolymer, vinylidene chloride and vinyl formal.

Thermosetting resins include, but are not limited to allyl phthalate, furane, melamine-formaldehyde, phenol-formaldehyde and phenol-furfural copolymers, alone or compounded with butadiene acrylonitrile copolymers or acrylonitrile-butadiene-styrene copolymers, polyacrylic esters, silicones, urea formaldehydes, epoxy resins, allyl resins, glyceryl phthalates and polyesters.

The printed wiring boards may include low or high $T_g$ resins. Low $T_g$ resins have a $T_g$ below 160° C. and high $T_g$ resins have a $T_g$ of 160° C. and above. Typically high $T_g$ resins have a $T_g$ of 160° C. to 280° C. or such as from 170° C. to 240° C. High $T_g$ polymer resins include, but are not limited to, polytetrafluoroethylene (PTFE) and polytetrafluoroethylene blends. Such blends include, for example, PTFE with polypheneylene oxides and cyanate esters. Other classes of polymer resins which include resins with a high $T_g$ include, but are not limited to, epoxy resins, such as difunctional and multifunctional epoxy resins, bimaleimide/triazine and epoxy resins (BT epoxy), epoxy/polyphenylene oxide resins, acrylonitrile butadienestyrene, polycarbonates (PC), polyphenylene oxides (PPO), polypheneylene ethers (PPE), polyphenylene sulfides (PPS), polysulfones (PS), polyamides, polyesters such as polyethyleneterephthalate (PET) and polybutyleneterephthalate (PBT), polyetherketones (PEEK), liquid crystal polymers, polyurethanes, polyetherimides, epoxies and composites thereof.

Conventional acid copper electroplating baths for plugging and filling through-holes may be used. Only one bath formulation directed to filling through-holes is used and the conventional process where the initial bath formulation is changed to a via filling bath formulation to complete through-hole filling is avoided. In addition to sources of copper ions, preferably, the copper electroplating baths include one or more brighteners, levelers and suppressors. Conventional brighteners, levelers and suppressors may be used.

Sources of copper ions include, but are not limited to water soluble halides, nitrates, acetates, sulfates and other organic and inorganic salts of copper. Mixtures of one or more of such copper salts may be used to provide copper ions. Examples include copper sulfate, such as copper sulfate pentahydrate, copper chloride, copper nitrate, copper hydroxide and copper sulfamate. Conventional amounts of copper salts may be used in the compositions. Copper salts are included in the bath in amounts of 50 g/l to 350 g/L, typically 100 g/L to 250 g/L.

Acids include, but are not limited to sulfuric acid, hydrochloric acid, hydrofluoric acid, phosphoric acid, nitric acid, sulfamic acid and alkylsulfonic acids. Such acids are included in conventional amounts. Typically such acids are included in the acid copper baths in amounts of 25 g/l to 350 g/L.

Brighteners include, but are not limited to 3-mercaptopropylsulfonic acid and its sodium salt, 2-mercapto-ethanesulfonic acid and its sodium salt, and bissulfopropyl disulfide and its sodium salt, 3-(benzthiazoyl-2-thio)-propylsulfonic acid sodium salt, 3-mercaptopropane-1-sulfonic acid sodium salt, ethylenedithiodipropylsulfonic acid sodium salt, bis-(p-sulfophenyl)-disulfide disodium salt, bis-(ω-sulfobutyl)-disulfide disodium salt, bis-(ω-sulfohydroxypropyl)-disulfide disodium salt, bis-(ω-sulfopropyl)-disulfide disodium salt, bis-(ω-sulfopropyl)-sulfide disodium salt, methyl-(ω-sulfopropyl)-disulfide sodium salt, methyl-(ω-sulfopropyl)-trisulfide disodium salt, O-ethyl-dithiocarbonic acid-S-(ω-sulfopropyl)-ester, potassium salt thioglycolic acid, thiophosphoric acid-O-ethyl-bis-(ω-sulfpropyl)-ester disodium salt, thiophosphoric, acid-tris(ω-sulfopropyl)-ester trisodium salt, N,N-dimethyldithiocarbamic acid (3-sulfopropyl) ester, sodium salt, (O-ethyldithiocarbonato)-S-(3-sulfopropyl)-ester, potassium salt, 3-[(aminoiminomethyl)-thio]-1-propanesulfonic acid and 3-(2-benzthiazolylthio)-1-propanesulfonic acid, sodium salt. Preferably the brightener is bissulfopropyl disulfide or its sodium salt. Typically the brighteners are included in amounts of 1 ppb to 500 ppm, preferably from 50 ppb to 10 ppm.

Levelers included in the acid copper electroplating baths for filling through-holes are preferably reaction products of heterocyclic aromatic compounds with epoxy compounds. Synthesis of such compounds is disclosed in the literature such as in U.S. Pat. No. 8,268,158. More preferably the levelers are reaction products of at least one imidazole compound of the formula:

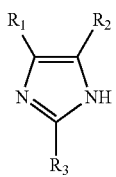

(II)

wherein $R_1$, $R_2$ and $R_3$ are independently chosen from H, $(C_1-C_{12})$alkyl, $(C_2-C_{12})$alkenyl, and aryl and provided that $R_1$ and $R_2$ are not both H. That is, the reaction products contain at least one imidazole wherein at least one of $R_1$ and $R_2$ is $(C_1-C_{12})$alkyl, $(C_2-C_{12})$alkenyl, or aryl. Such imidazole compound is substituted with a $(C_1-C_{12})$alkyl, $(C_2-C_{12})$alkenyl, or aryl at the 4- and/or 5-position. Preferably, $R_1$, $R_2$ and $R_3$ are independently chosen from H, $(C_1-C_8)$alkyl, $(C_2-C_7)$alkenyl and aryl, more preferably H, $(C_1-C_6)$alkyl, $(C_3-C_7)$alkenyl and aryl, and even more preferably H, $(C_1-C_4)$alkyl, $(C_3-C_6)$alkenyl and aryl. The $(C_1-C_{12})$alkyl groups and the $(C_2-C_{12})$alkenyl groups may each optionally be substituted with one or more of hydroxyl groups, halogen, and aryl groups. Preferably, the substituted $(C_1-C_{12})$alkyl group is an aryl-substituted $(C_1-C_{12})$alkyl group, and more preferably is $(C_1-C_4)$alkyl. Exemplary are $(C_1-C_4)$alkyl groups include, without limitation, benzyl, phenethyl, and methylnaphthyl. Alternatively, each of the $(C_1-C_{12})$alkyl groups and the $(C_2-C_{12})$alkenyl groups may contain a cyclic alkyl or cyclic alkenyl group, respectively, fused with an aryl group. As used herein, the term "aryl" refers to any organic radical derived from an aromatic or heteroaromatic moiety by the removal of a hydrogen atom. Preferably, the aryl group contains 6-12 carbon atoms. The aryl group in the present invention may optionally be substituted with one or more of $(C_1-C_4)$alkyl and hydroxyl. Exemplary aryl groups include, without limitation, phenyl, tolyl, xylyl, hydroxytolyl, phenolyl, naphthyl, furanyl, and thiophenyl. The aryl group is preferably phenyl, xylyl or naphthyl. Exemplary $(C_1-C_{12})$alkyl groups and substituted $(C_1-C_{12})$alkyl groups include, without limitation, methyl, ethyl, n-propyl, isopropyl, n-butyl, iso-butyl, sec-butyl, n-pentyl, 2-pentyl, 3-pentyl, 2-(2-methyl)butyl, 2-(2,3-dimethyl)butyl, 2-(2-methyl)pentyl, neopentyl, hydroxymethyl, hydroxyethyl, hydroxypropyl, cyclopentyl, hydroxcyclopentyl, cyclopentylmethyl, cyclopentylethyl, cyclohexyl, cyclohexylmethyl, hydroxyclohexyl, benzyl, phenethyl, naphthylmethyl, tetrahydronaphthalenyl and tetrahydronaphthylmethyl. Exemplary $(C_2-C_8)$alkenyl groups include, but are not limited to allyl, styrenyl, cyclopentenyl, cyclopentylmethyl, cyclopentenylethyl, cyclohexenyl, cyclohexenylmethyl and indenyl. Preferably, the at least one imidazole compound is substituted with a $(C_1-C_8)$alkyl, $(C_3-C_7)$alkenyl, or aryl at the 4- or 5-position. More preferably, the at least one imidazole is substituted with $(C_1-C_6)$alkyl, $(C_3-C_7)$alkenyl, or aryl at the 4- or 5-position. Still more preferably, at least one imidazole is substituted at the 4- or 5-position with methyl, ethyl, propyl, butyl, allyl or aryl. The imidazole compounds are generally commercially available from a variety of sources, such as Sigma-Aldrich (St. Louis, Mo.) or may be prepared from literature methods.

One or more of the above described imidazole compounds are reacted with one or more epoxy compounds having formula:

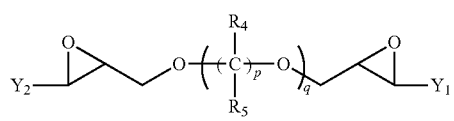

(III)

where $Y_1$ and $Y_2$ are independently chosen from hydrogen and $(C_1-C_4)$alkyl, $R_4$ and $R_5$ are independently chosen from hydrogen, $CH_3$ and OH, p=1-6 and q=1-20. Preferably, $Y_1$ and $Y_2$ are both H. When p=2, it is preferred that each $R_4$ is H, $R_5$ is chosen from H and $CH_3$, and q=1-10. When p=3, it is preferred that at least one $R_5$ is chosen from $CH_3$ and OH, and q=1. When p=4, it is preferred that both $R_4$ and $R_5$ are H, and q=1. Exemplary compounds of formula (III) include, but are not limited to: 1,4-butanediol diglycidyl ether, ethylene glycol diglycidyl ether, di(ethylene glycol) diglycidyl ether, poly(ethylene glycol) diglycidyl ether compounds, glycerol diglycidyl ether, neopentyl glycol diglycidyl ether, propylene glycol diglycidyl ether, di(propylene glycol) diglycidyl ether, and poly(propylene glycol) diglycidyl ether compounds. Poly(ethylene glycol) diglycidyl ether compounds of formula III are those compounds where each of $R_4$ and $R_5$=H, p=2, and q=3-20, and preferably q=3-15, more preferably q=3-12, and still more preferably q=3-10. Exemplary poly(ethylene glycol) diglycidyl ether compounds include tri(ethylene glycol) diglycidyl ether, tetra(ethylene glycol) diglycidyl ether, penta(ethylene glycol) diglycidyl ether, hexa(ethylene glycol) diglycidyl ether, nona(ethylene glycol) diglycidyl ether, deca(ethylene glycol) diglycidyl ether, and dodeca(ethylene glycol) diglycidyl ether. Poly(propylene glycol) diglycidyl ether compounds of formula III are those compounds where each of $R_4$=H and one of $R_5$=CH$_3$, p=2, and q=3-20, and preferably q=3-15, more preferably q=3-12, and still more preferably q=3-10. Exemplary poly(propylene glycol) diglycidyl ether compounds include tri(propylene glycol) diglycidyl ether, tetra(propylene glycol) diglycidyl ether, penta(propylene glycol) diglycidyl ether, hexa(propylene glycol) diglycidyl ether, nona(propylene glycol) diglycidyl ether, deca(propylene glycol) diglycidyl ether, and dodeca(propylene glycol) diglycidyl ether. Suitable poly(ethylene glycol) diglycidyl ether compounds and poly(propylene glycol) diglycidyl ether compounds are those having a number average molecular weight of from 350 to 10000, and preferably from 380 to 8000.

Other additives which may be included in the acid copper electroplating baths are one or more complexing agents, one or more sources of chloride ions, stabilizers such as those which adjust mechanical properties, provide rate control, refine grain structure and modify deposit stress, buffering agents, suppressors and carriers. They may be included in the acid copper electroplating bath in conventional amounts.

Through-hole filling is typically done at current densities of 0.1 ASD to 5 ASD, preferably from 0.5 ASD to 3 ASD. The plating bath temperature may range from room temperature to 60° C., typically from room temperature to 40° C. Electroplating is done until the through-holes are filled with minimum copper on the surfaces to make it easier for post treatment and prepare the substrate for further processing.

The methods reduce or inhibit dimple formation and voids during through-hole filling. The % void area of through-holes is reduced or eliminated. The forward pulse method can provide through-hole filling with 10% to 15% voids or less, such as 0% to 2%. Dimple formation is 10 μm or less, typically dimple size is less than 10 μm with no voids in the through-holes which is the preferred industry standard. The reduced depth of the dimples and voids improves throwing power, thus provides a substantially uniform copper layer on the surface of the substrate.

The following examples are included to further illustrate the invention but are not intended to limit its scope.

Example 1 (Comparative)

An FR4/glass-epoxy coupon 5 cm wide, 15 cm long and 200 μm thick with a plurality of through-holes was provided by Tech Circuit. The through-holes had an average diameter of 100 μm. The coupon was plated with CIRCUPOSIT™ 880 Electroless Process plating formulation and method (available from Dow Electronic Materials, Marlborough, Mass.) to form a copper layer on one side of the coupon and on the walls of the through-holes. The thickness of the copper layer on the coupon was 0.3 μm. The coupon was pre-cleaned using a conventional copper cleaner. The coupon was then placed in a Haring cell which contained a copper electroplating bath with a formula as shown in Table 1.

TABLE 1

| COMPONENT | AMOUNT |
| --- | --- |
| Copper sulfate pentahydrate | 220 g/L |
| Sulfuric acid | 40 g/L |
| Chloride ion from hydrochloric acid | 50 ppm |
| Polyethylene glycol | 2 g/L |
| 4-phenylimidazole/imidazole/1,4-butanediol diglycidyl ether copolymer | 50 mg/L |
| Bis-sodium sulfopropyl)-disulfide | 10 mg/L |

The coupon was connected to a conventional DC rectifier. The counter electrode in the Haring cell was a DT-4 iridium coated titanium insoluble anode. The plating bath was air agitated during electroplating at 2.4 L/minute. The DC current density was set at 1.5 ASD. Copper electroplating was done for 50 ms at room temperature to plug and fill all of the through-holes.

Figure 2:
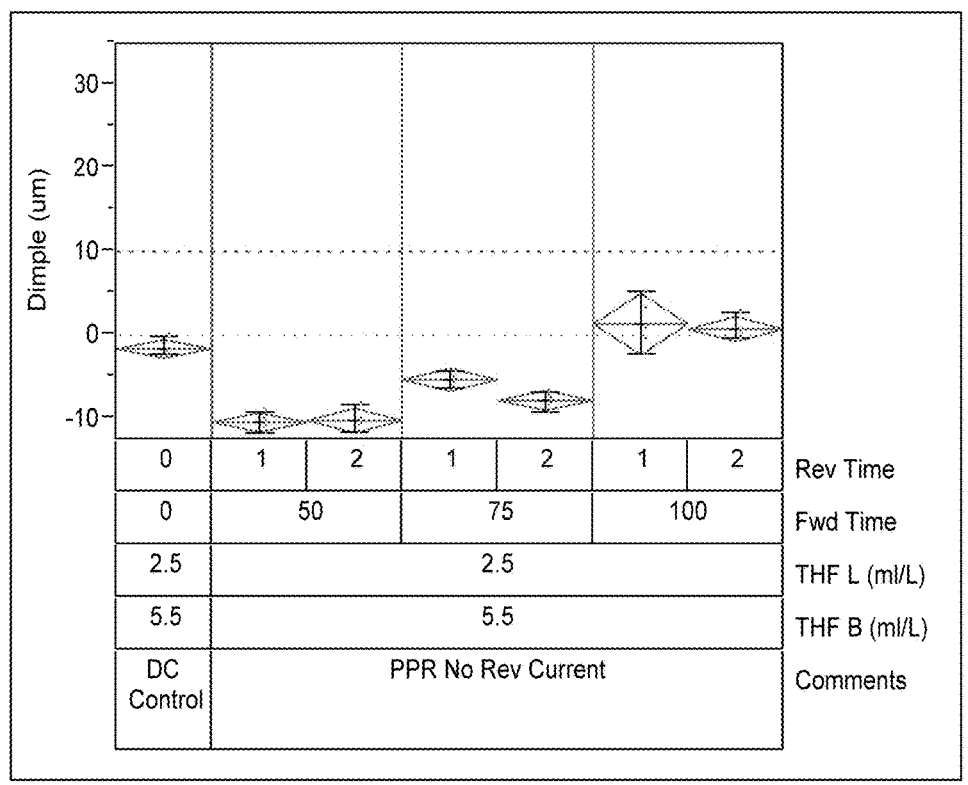
FIG. 2 is a graph of average dimple size of through-holes in microns vs. forward pulse current density plating time.
Figure 3:
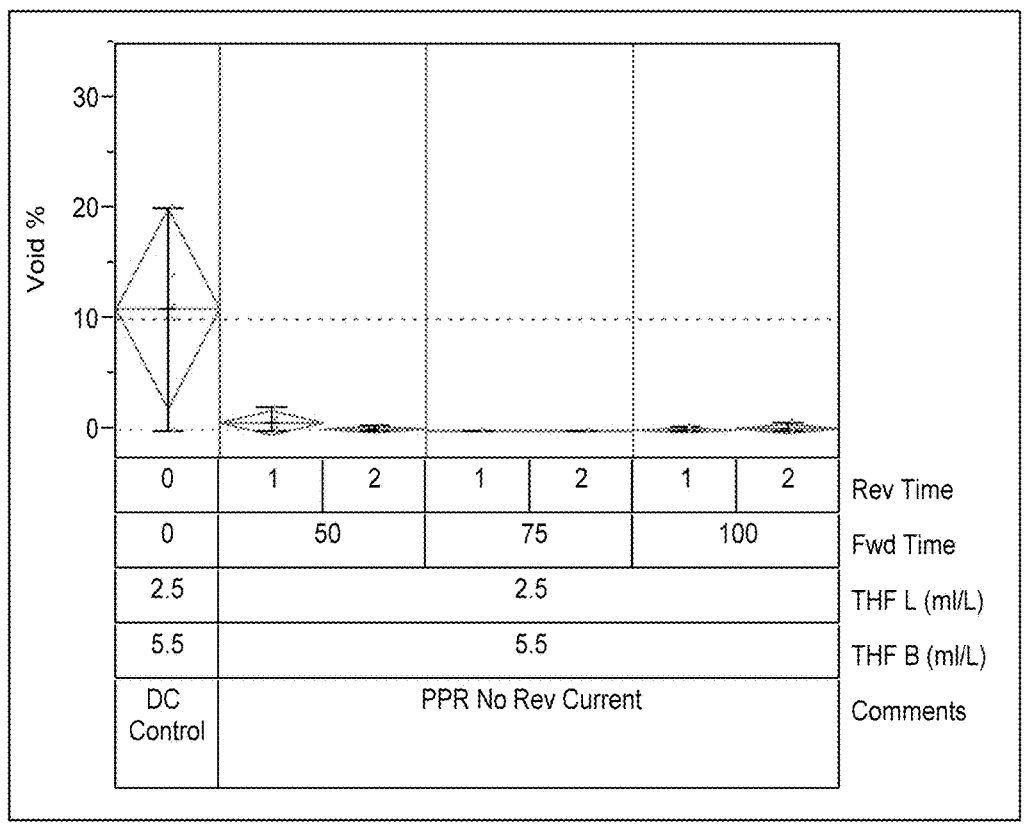
FIG. 3 is a graph of percent void area in through-holes vs. forward pulse current density plating time.

After electroplating the coupon was removed from the Haring cell, rinsed with DI water and sectioned for an analysis of through-hole filling. The sectioned samples were examined for dimples and voids using a conventional optical microscope in combination with Leica Application Suit V3 (available from Leica Microsystems). The dimple depth was the distance from the deepest part of the dimple to the level of the copper layer on the surface of the coupon as measured in microns. The area of a particular void was determined using the formula: void area=0.5 A×0.5 B×π where A is the height of the void and B is the diameter of the void at its widest point. The formula used to determine % void area=void area/hole area×100% where hole area is height of the through-hole×the diameter of the through-hole. Five through-holes for each sectioned sample were examined. The results of the dimple size measurements are recorded in FIG. 2, first column designated DC Control. The plot indicates the range as well as the average dimple size of the five samples. The average dimple size was determined to be −2. The negative value for the dimple indicates that the dimple in the through-holes was above the surface of the coupon. In other words, the dimple was more of a bump on the surface than an actual dimple or surface depression. The results of the percent voids are recorded in FIG. 3, first column also designated as DC Control. The plot indicates the range and the average percent void area in the through-holes analyzed. The average percent void area was determined to be 11%. Although the average dimple size was below 10 μm, no nodules were observed and the deposit was mirror bright, the average percent void area was at an unacceptable 11%.

Example 2

Six FR4/glass-epoxy coupons 5 cm wide, 15 cm long and 200 μm thick with a plurality of through-holes were provided by Tech Circuit. The through-holes had an average diameter of 100 μm. The coupons were plated with CIRCUPOSIT™ 880 Electroless Process plating formulation and method (available from Dow Electronic Materials, Marlborough, Mass.) to form a copper layer on one side of the coupon and on the walls of the through-holes. The thickness of the copper layer on each coupon was 0.3 μm. The coupons were pre-cleaned using a conventional copper cleaner. The coupons were then placed in Haring cells which contained a copper electroplating bath with a formula as shown in Table 1 above.

The coupons were connected to a conventional DC rectifier. The counter electrodes in the Haring cells were insoluble anodes. The plating baths were air agitated during electroplating at 2.4 L/minute. Plating was done at room temperature. The current density was set at 1.5 ASD. Two of the coupons were electroplated by a forward current density for 50 ms without reverse current. The current density was interrupted for one coupon for 1 ms and for 2 ms for the second coupon. The cycle was repeated until the through-holes in the coupon were filled with a copper surface thickness of 25 µm. The second set of coupons were plated with a forward current density for 75 ms without reverse current with interruptions of 1 ms and 2 ms and the third set of coupons were plated with a forward current density time of 100 ms without reverse current and current interruptions also at 1 ms and 2 ms.

After electroplating the coupons were removed from the Haring cells, rinsed with DI water and sectioned for an analysis of through-hole filling. The sectioned samples were examined for dimples and voids using a conventional optical microscope in combination with Leica Application Suit V3 (available from Leica Microsystems) as described above. The results of the dimple size measurements are recorded in FIG. 2, columns 2-4 designated PPR No Rev Current. The plot indicates the range as well as the average dimple size of five samples from each coupon. The average dimple size for the coupons plated for 50 ms with interruptions at 1 ms and 2 ms was determined to be −11 µm. The average dimple size for coupons plated for 75 ms with current interruptions for 1 ms was −5 µm and for 2 ms was −9 µm. The average dimple size for the coupons plated for 100 ms was 2 µm for 1 ms and 1 µm for 2 ms. The results of the percent voids are recorded in FIG. 3, columns 2-4 designated PPR No Rev Current. The plot indicates the range and the average percent void area in the through-holes analyzed. The average percent void area for the coupon plated with a forward current density for 50 ms had an average void area of 1%. The remainder of the coupons had average void areas of 0%. None of the other samples analyzed showed voids. Also all of the samples plated bright deposits and there were no visible nodules on the copper layers. While the coupons in Example 1 (Comparative) plated with DC and the coupons plated using the forward pulse current with current interruptions and without reverse current showed good dimple levels below 10 µm, the coupons plated with the forward pulse current with current interruptions had greatly improved percent void results.

Example 3

The method described in Example 2 was repeated using four FR4/glass-epoxy coupons 5 cm wide, 15 cm long and 200 µm thick with through-holes having an average diameter of 100 µm. The forward pulse time was either 20 ms or 35 ms and the interruption times were either 1 ms or 2 ms. There was no reverse current. The coupons were sectioned and analyzed for dimple size and percent void area as described in Example 2 above. The coupons which were plated at a forward current density for 20 ms with 1 ms current interruptions had an average dimple size of 4.3 µm and the coupons with current interruptions of 2 ms had an average dimple size of 5.4 µm. The coupons which were plated with a forward current density for 35 ms with 1 ms interruptions had an average dimple size of −2.78 and the coupons with the 2 ms interruptions had an average dimple size of 6.67. All of the through-holes analyzed all fell below 10 µm. None of the coupons analyzed showed voids. Also, no nodules were observed.

What is claimed is:

1. A method comprising:
 a) providing a printed circuit board with a plurality of through-holes comprising a layer of electroless copper, copper flash or combinations thereof on a surface of the printed circuit board and walls of the plurality of through-holes;
 b) immersing the printed circuit board in a copper electroplating bath comprising an anode; and
 c) filling the through-holes with copper by a pulse plating cycle consisting of: applying a forward current density for 10 ms to 200 ms followed by interrupting the forward current density for 1 ms to 2 ms and applying a second forward current density for 10 ms to 200 ms and interrupting the second forward current density for 1 ms to 2 ms; applying a forward current density for 20 ms to 100 ms followed by interrupting the forward current density for 1 ms to 2 ms and applying a second forward current density for 20 ms to 100 ms and interrupting the second forward current density for 1 ms to 2 ms; and applying a forward current density for 0.5 ms to 5 ms followed by interrupting the forward current density for 1 ms to 2 ms and applying a second forward current density for 0.5 ms to 5 ms and interrupting the second forward current density for 1 ms to 2 ms; and optionally repeating the pulse plating cycle, wherein a pulse of the pulse plating cycle is never anodic.

2. The method of claim 1, wherein the forward current density and the second forward current density ranges from 0.1 ASD to 5 ASD.

3. The method of claim 2, wherein the forward current density and the second forward current density ranges from 0.5 ASD to 3 ASD.

4. The method of claim 3, wherein the forward current density and the second forward current density ranges from 1 ASD to 2 ASD.

5. The method of claim 1, wherein the printed circuit board is 100 µm thick or greater.

6. The method of claim 5, wherein the printed circuit board is 200 µm to 300 µm thick.

* * * * *